(12) United States Patent
Miller

(10) Patent No.: US 6,218,910 B1
(45) Date of Patent: Apr. 17, 2001

(54) HIGH BANDWIDTH PASSIVE INTEGRATED CIRCUIT TESTER PROBE CARD ASSEMBLY

(75) Inventor: Charles A. Miller, Fremont, CA (US)

(73) Assignee: Formfactor, Inc., Livermore, CA (US)

( * ) Notice: Subject to any disclaimer, the term of this patent is extended or adjusted under 35 U.S.C. 154(b) by 0 days.

(21) Appl. No.: 09/258,186

(22) Filed: Feb. 25, 1999

(51) Int. Cl.[7] .............. H03H 7/38; H01P 3/08; H01P 1/00; G01R 31/26
(52) U.S. Cl. .............. 333/33; 333/246; 333/247; 324/765
(58) Field of Search .............. 333/33, 246, 247; 324/754, 765

(56) References Cited

U.S. PATENT DOCUMENTS

| | | | |
|---|---|---|---|
| 4,354,268 | * 10/1982 | Michel et al. | 324/73 R |
| 4,523,312 | 6/1985 | Takeuchi | 371/1 |
| 4,616,178 | * 10/1986 | Thornton, Jr. et al. | 324/158 |
| 4,837,622 | * 6/1989 | Whann et al. | 324/158 P |
| 5,090,118 | * 2/1992 | Kwon et al. | 324/158 P |
| 5,406,210 | * 4/1995 | Pedder | 324/757 |
| 5,546,405 | * 8/1996 | Golla | 371/22.1 |
| 5,642,054 | * 6/1997 | Pasiecznik, Jr. | 324/754 |

FOREIGN PATENT DOCUMENTS

| | | | |
|---|---|---|---|
| 0513992A1 | 6/1992 | (EP) | G01R/1/067 |
| 96/15458 | 5/1996 | (WO) . | |

OTHER PUBLICATIONS

W.H. Hayward, Introduction to Radio Frequency Design, Prentice Hall, Inc., 1982, Englewood Cliffs, New Jersey, pp. 59–68.

* cited by examiner

Primary Examiner—Robert Pascal
Assistant Examiner—Patricia T. Nguyen
(74) Attorney, Agent, or Firm—Daniel J. Bedell; Smith-Hill and Bedell

(57) ABSTRACT

Described herein is a probe card assembly providing signal paths for conveying high frequency signals between bond pads of an integrated circuit (IC) and an IC tester. The frequency response of the probe card assembly is optimized by appropriately distributing, adjusting and impedance matching resistive, capacitive and inductive impedance values along the signal paths so that the interconnect system behaves as an appropriately tuned Butterworth or Chebyshev filter.

22 Claims, 4 Drawing Sheets

HIGH BANDWIDTH PASSIVE INTEGRATED CIRCUIT TESTER PROBE CARD ASSEMBLY

CROSS-REFERENCE TO RELATED APPLICATIONS

The subject matter of the present application is related to that of copending U.S. application Ser. No. 09/258,184, filed concurrently herewith. The subject matter of the present application is also related to that of copending U.S. application Ser. No. 09/258,185, filed concurrently herewith.

BACKGROUND OF THE INVENTION

1. Field of the Invention

The present invention relates in general to a probe card assembly for interconnecting test equipment to an integrated circuit die to be tested, and in particular to a probe card assembly that implements each signal path as a high-bandwidth, low-distortion, impedance-matched filter structure between the test equipment and the die.

2. Description of Related Art

An integrated circuit (IC) die typically includes a set of bond pads on its upper surface acting as input/output terminals for the integrated circuit die. When an IC die is packaged, its bond pads provide points of connection for bond wires or other structures that link the IC to external circuits. These bond pads may also provide access points to an IC tester when testing an IC die before it is separated from a wafer and packaged.

An IC tester typically includes a separate channel for each terminal of an IC to be tested, and during a test each channel may transmit a test signal to the IC terminal or may receive and process an IC output signal appearing at the IC terminal. Each channel is typically implemented on a separate circuit board mounted in a relatively large chassis called a "test head". The tester normally includes a probe card assembly for providing signal paths between the circuit boards mounted in the test head and the IC's bond pads.

PCT published application WO 96/15458, published May 23, 1996 (incorporated herein by reference) describes a high performance probe card assembly including a set of three separate layers stacked vertically under the test head. One layer of the assembly, a "probe card" mounted on the probe head, provides points of contact on its surface for pogo pin connectors extending from the circuit boards mounted in the test head. The pogo pins act as input and/or output terminals for the test equipment implemented by those circuit boards. A "space transformer" layer of the probe card assembly includes a set of probes on its underside for contacting the bond pads on the upper surface of the die. An "interposer" board residing between the probe card and the space transformer provides signal routing paths between the probe card and the space transformer therebetween through spring contacts on its surfaces for contacting pads on facing surfaces of the probe card and space transformer.

To test a die at high frequencies it is helpful to position test equipment as closely as possible to the bond pads of the IC being tested so as to reduce the amount of time signals require to travel between the test equipment and the IC's bond pads. Since the circuit boards in the test head are much larger than the IC die they are to test, the pogo pins through which the circuit boards send and receive signals are necessarily distributed over a much wider horizontal area than the bond pads on the die being tested. Thus the probe assembly must not only route signals vertically between the bond pads and the pogo pins, it also must also route them horizontally. The probes, pogo pins, spring contracts between the various boards of the assembly, and vias within those boards move test signals vertically between the bond pads and the tester circuits. Microstrip traces on the surfaces or layers of the various boards of the probe assembly route those signals horizontally.

One of the reasons tester designers want to minimize the length of the signal paths between the bond pads and the circuits is to minimize delay and impedance discontinuities in those signal paths. When those paths carry high frequency test and IC output signals, impedance discontinuities in the signal path can attenuate and distort those signals. The inherent series inductance and shunt capacitance of the signal routing paths are primary sources of impedance continuities that can lead to signal distortion.

The typical approach to reducing the amount of signal distortion and attenuation caused by the interconnect system has been to minimize signal path lengths and to match transmission line impedances. In doing so, designers typically try to minimize the physical size of the tester circuits, at least in the horizontal plane, so that they can be packed into a smaller horizontal space above or below the IC under test. This minimizes the horizontal distance that signals must travel between the test equipment and the IC bond pads they access. Designers also try to minimize signal path lengths in the interconnect system by making the probe card assembly as thin as possible in the vertical direction, for example by providing probes and pogo pins that are as short as possible, by making the probe card, interposer and space transformer as thin as possible, and by providing spring contacts or other contact structures between those boards that are as short as possible.

Another approach to reducing signal distortion in the signal paths between IC bond pads and the test equipment accessing them has been to minimize the amount of shunt capacitance in those signal paths. Capacitance can be reduced by appropriately choosing physical characteristics of the probes and the various layers of the probe card assembly including the size of the traces, their spacing from ground planes, and the dielectric nature of the insulating material forming those probe card assembly layers. Since vias, conductors passing vertically through the probe card, interposer and space transformer are also a source of shunt capacitance, probe card assembly designers typically structure vias so as minimize their capacitance, typically by providing a relatively wide hole through any ground or power plane through which they pass, since the capacitance of a signal path is inversely related to distance between the signal path and any ground or power planes.

Minimizing interconnect system signal path lengths, minimizing inductance and capacitances of those signal paths, and matching transmission line impedances throughout those signal paths, can help increase the bandwidth, flatten frequency response and reduce the signal distortion. But it is not possible to reduce signal path lengths to zero or to completely eliminate probe card assembly signal path inductance and capacitance. Thus some level of signal distortion and attenuation is inevitable when signal frequencies are sufficiently high. Since distortion and attenuation increase with signal frequency, such signal distortion and attention provide a barrier to accurate high frequency testing.

What is needed is a way to substantially improve the frequency response of signal paths though a probe card assembly so as to reduce distortion and attenuation of signals below a level that can be provided by simply minimizing the lengths and impedances of those signal paths.

SUMMARY OF THE INVENTION

The present invention is an improvement to conventional probe card assemblies of the type that interconnect bond pads of an integrated circuit (IC) die to IC test equipment installed in a test head of an integrated circuit tester. In accordance with the invention, each signal path is arranged and adapted to provide a filter function that optimizes relevant characteristics of the path's frequency response and impedance characteristics by appropriately adjusting the magnitudes of its shunt capacitance and series inductance relative to one another. For example when the test equipment and the die communicate using a low frequency analog signal where it is most important to avoid distortion, the "optimal" frequency response of the signal path conveying that signal may have a narrow, but maximally flat, pass band. Or, as another example, when the test equipment and die communicate via a high frequency digital signal, the optimal frequency response may have a maximally wide passband. By appropriately distributing and adjusting the inductance and capacitance of a signal path though a probe card assembly in accordance with the invention, rather than trying to simply minimize them or treat them as transmission line segments, substantial improvement in probe card assembly frequency response is obtained.

It is accordingly an object of the invention to provide a system for interconnecting test equipment to terminals of an integrated circuit device wherein the frequency response and impedance matching characteristics of the interconnect system are optimized for the nature of signals passing therebetween.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 3:
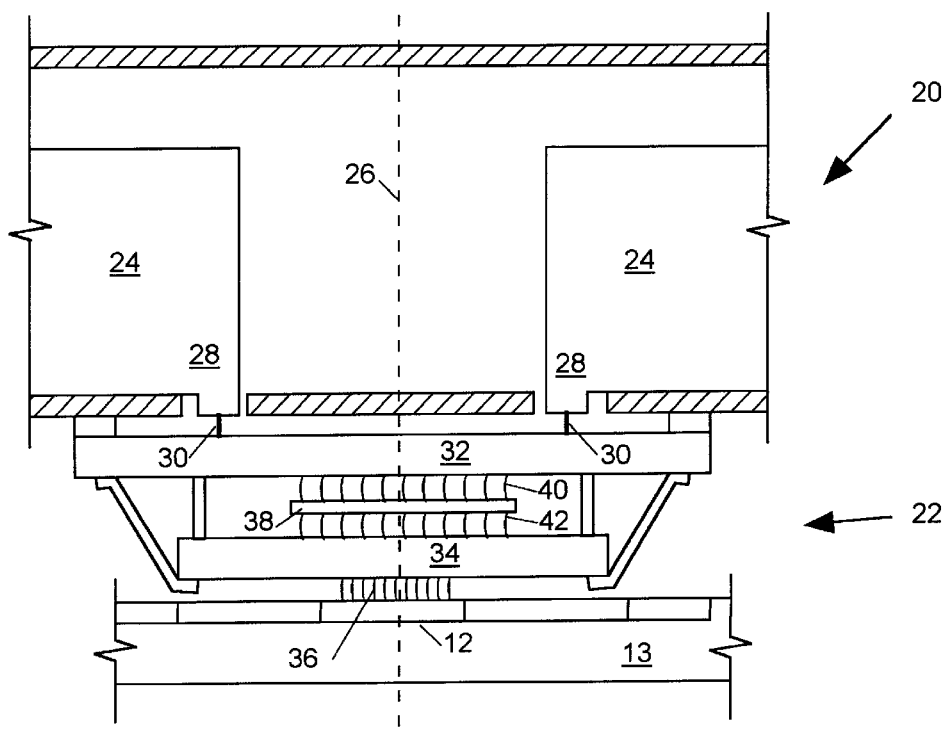
FIG. 3 is a simplified sectional elevation view of the test head of FIG. 2 and of a probe card assembly in accordance with the invention for linking the test head to an integrated circuit device under test (DUT)
Figure 4:
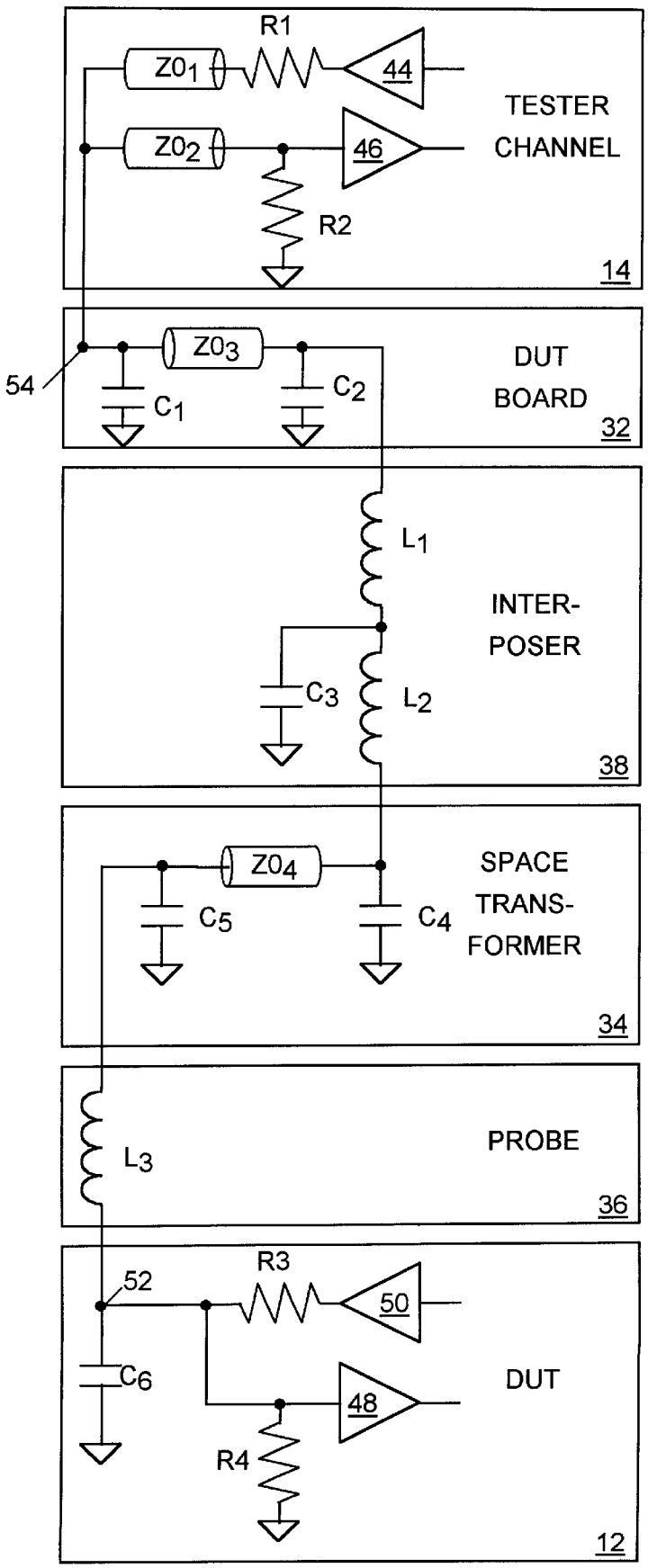
Figure 5:
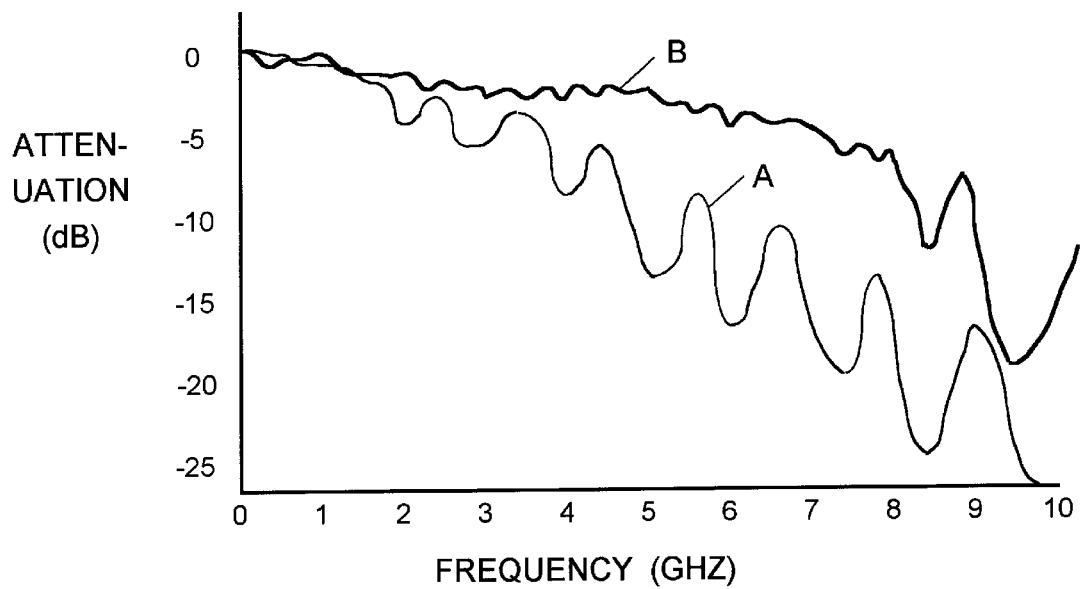

FIG. 4 is an equivalent circuit diagram modeling a single signal path between one channel of the tester head of FIGS. 3 and a bond pad of a DUT; and FIG. 5 compares frequency response characteristics of the equivalent circuit of FIG. 4 when the inductance and capacitance values are minimized in accordance with prior art practice (plot A) and when inductance and capacitance values are adjusted in accordance with the present invention.

DESCRIPTION OF THE PREFERRED EMBODIMENT(S)

Figure 1:
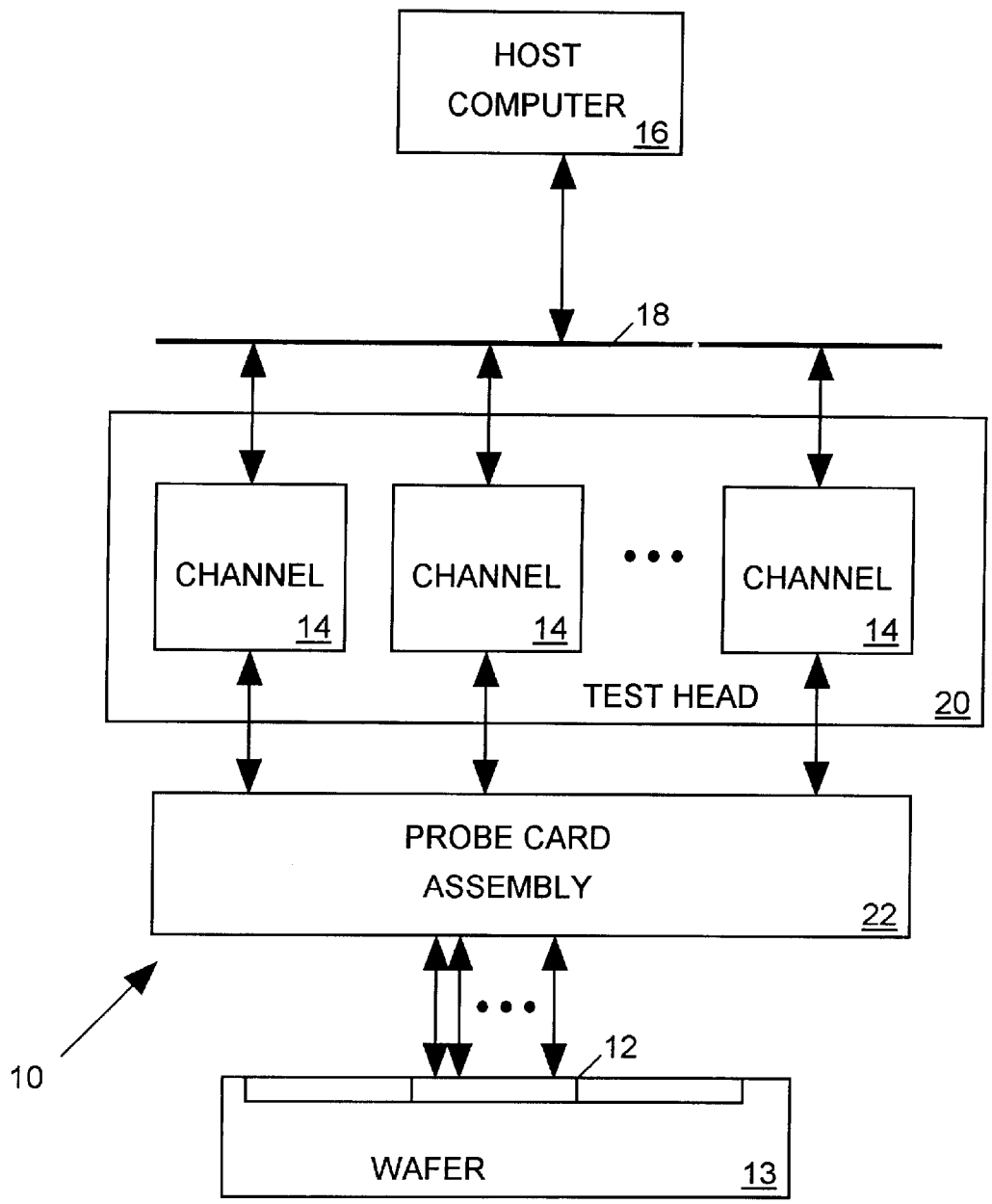
FIG. 1 is a block diagram of an integrated circuit tester.

The present invention relates to integrated circuit (IC) testers and in particular to an improved probe card assembly for conveying signals between bond pads of an integrated circuit device under test (DUT) and the various channels of an IC tester that access the DUT during a test. FIG. 1 illustrates a typical IC tester 10 in block diagram form for performing a test on a DUT 12, suitably in the form of a die on a silicon wafer 13 that has not yet been separated from the wafer and packaged. An IC die typically includes a set of bond pads on its upper surface that are linked to internal circuit nodes and which act as input/output terminals for the IC. The bond pads on a die may provide points of connection for bond wires linking the circuit nodes to pins or legs of an IC package. However when the die is tested before it is packaged, those bond pads may be used as points of contact for probes from the tester for conveying signals between the tester and the internal circuits of the IC.

Tester 10 includes a set of channels 14, one for each bond pad on DUT 12. During a test, each channel 14 may either generate and transmit a digital or analog test signal input to a bond pad of DUT 12 or may receive and process a digital or analog DUT output signal delivered through a bond pad. Before the start of the test, a host computer 16 transmits instructions to each channel 14 via a bus 18. During the test, a pattern generator within each channel 14 executes those instructions to produce a sequence of vectors (data values) telling the channel what to do during successive cycles of the test. At the end of the test, channels 14 send results data back to host computer 14 reporting on the behavior of the DUT output signals they monitored during the test.

Channels 14 are implemented on a set of printed circuit boards which, in the example tester architecture of FIG. 1, are mounted within an equipment chassis called a "test head" 20. Channels may also be mounted remote from a test head but linked thereto through transmission lines. A probe card assembly 22, including the probes that contact the bond pads of DUT 12, provides signal paths between those bond pads and the circuit boards in the test head implementing channels 14. Modern testers operating at high frequencies position test head 20 as close as possible to DUT 12 in order to minimize signal transit time between tester channels 14 and the IC's bond pads. IC tester designers also try to minimize the length of the signal paths between the bond pads and channels 14 in order to minimize the impedance of those signal paths since signal path impedance can significantly attenuate and distort the DUT input and output signals.

While the example tester architecture of FIG. 1 is commonly employed, many other tester architectures have been used. For example, many testers centralize the pattern generation function of channels 14 by providing a central pattern generator to supply data to the channels during the test. Also in some testers channels 14 are mounted remote from the test head and connected thereto through transmission lines. The invention is applicable to all tester architectures.

Figure 2:
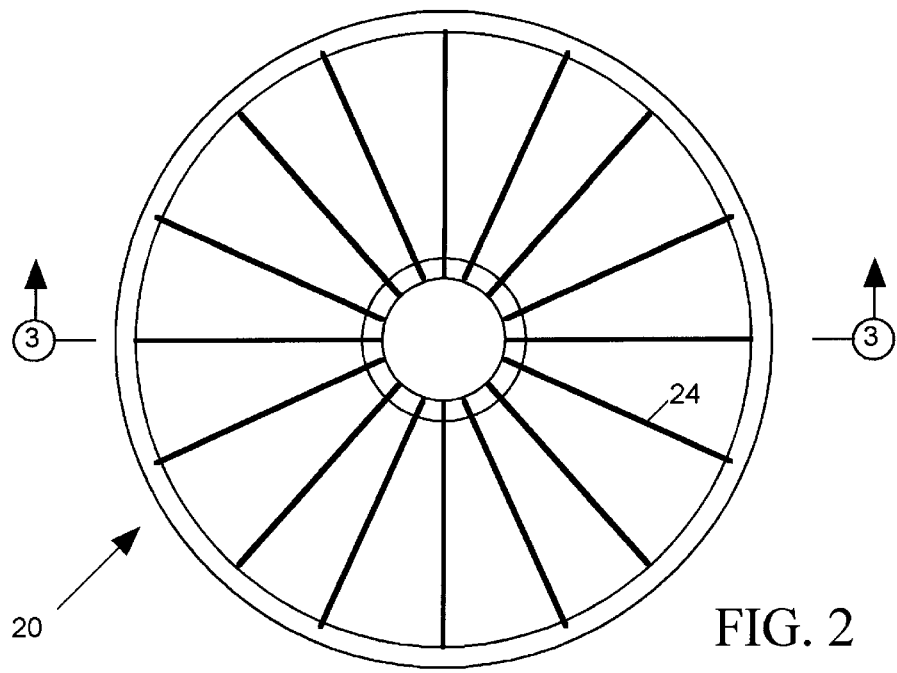
FIG. 2 is a simplified sectional plan view of the test head of the integrated circuit tester of FIG. 1.

FIG. 2 is a simplified sectional plan view of test head 20 of FIG. 1 including a set of circuit boards 24 implementing channels 14 of FIG. 1. FIG. 3 includes a partial sectional elevation view of test head 20 of FIG. 2 along with an elevation view of a probe card assembly 22 linking circuit boards 24 to bond pads on an IC die (DUT 12) formed on a wafer 13. In order to emphasize various parts of the probe card assembly 22, FIGS. 2 and 3 are intentionally not to scale. For example, those skilled in the art will appreciate, in particular, that test head 20 is much wider and taller relative to DUT 12 than is apparent from FIG. 3.

Since circuit boards 24 implementing channels 14 of FIG. 1 within test head 20 are much larger than DUT 12 they are to test, channels 14 are necessarily distributed over a much wider horizontal area than the bond pads of DUT 12. Thus probe assembly 22 must not only route signals vertically between the bond pads of DUT 12 and circuit boards 24, it also must also route those signals horizontally. As discussed below, various probes, pogo pins, spring contacts, and vias within various layers forming probe card assembly 22 move test signals vertically, while microstrip and stripline traces included within the various layers of the probe assembly 22 route those signals horizontally.

Designers typically try to minimize the physical size of circuit boards 24, at least in the horizontal plane, so that they can be packed into a smaller horizontal space above or below DUT 12. This minimizes the horizontal distance that signals must travel between the tester channels and the IC bond pads they access. Circuit boards 24 are radially arrayed about a central vertical axis 26 passing through DUT 12 below the test head 20 so that all circuit boards 24 are substantially the same distance from DUT 12. Each circuit board 24 is suitably arranged with its signal drivers and receivers mounted near the lower-most corner 28 of the circuit board nearest axis 26. One or more pogo pin connectors 30 extending downward from corner 28 of each circuit board 24, suitably convey signals between circuit board 24 and probe card assembly 22. By radially arraying circuit boards 24 about central axis 26 and positioning their drivers and receivers at corners 28, we help minimize the distance that test and DUT output signals must travel.

Probe card assembly 22, which conveys signals between DUT 12 and the pogo pins 30 of circuit boards 24, includes a set of three vertically stacked layers. The primary layer of probe card assembly 22, a "probe card" 32, is mounted directly beneath probe head 20. Probe card 32 provides points of contact on its upper surface for the pogo pin connectors 30 that act as input and/or output terminals for the tester channels 14 implemented by circuit boards 24. A "space transformer" 34 includes a set of probes 36 oriented for contacting the bond pads on DUT 12. An "interposer" 38 positioned between probe card 32 and space transformer 34 includes spring contacts 40 and 42 on its upper and lower surfaces for providing signal paths between contact pads on the facing surfaces of probe card 32 and space transformer 34.

A probe card assembly generally similar to probe card assembly 22 of FIG. 3 is described in more detail in PCT published application WO 96/15458, published May 23, 1996 and incorporated herein by reference. It should be understood that while the preferred embodiment of the invention is illustrated herein in connection with the particular probe card assembly architecture described herein, the invention described herein is also applicable to other kinds of probe card assembly architectures.

Designers also try to minimize signal path lengths by making probe card assembly 22 as thin as possible in the vertical direction, for example by providing probes 36 and connectors 40 and 42 that are as short as possible and by making probe card 32, space transformer 34 and interposer 38 as thin as possible. However since there are structural limitations as to how small, thin and short we can make the various components of probe card assembly 22, signals must still travel a significant distance between pogo pins 30 and bond pads on the surface of DUT 12, and the impedance of the signal paths they follow distorts and attenuates those signals.

With signal path distance minimized to the extent possible, the next step in reducing signal distortion and attenuation in the signal paths between IC bond pads and the tester channels has been to carefully design those signal paths so as to minimize their impedances, particularly their shunt capacitance and series inductance. The capacitance of a signal path depends largely on its area, on its spacing and orientation relative to nearby ground and power planes, and on the dielectric constant of the material between the path and those ground and power planes. Thus the capacitance of the signal paths through probe card assembly 22 can be further reduced by appropriately choosing physical characteristics of probes 36, of contacts 40 and 42, and of the various traces and vias within the layers of probe card assembly 22 forming those signal paths.

The series inductance of a signal path is largely a function of its length, so when we reduce length of a signal path, we also reduce its inductance. However, it is well-known that other physical characteristics of a signal path, such as its width and its spacing relative to other conductors, can also influence path inductance. Probe card assembly designers have expended considerable effort to further reduce the inductance of signal paths through probe card assemblies by appropriately adjusting such physical characteristics of those paths.

Although minimizing the signal path inductance and capacitances through probe card assembly 22 can generally increase bandwidth and reduce signal distortion, it is not possible to completely eliminate signal path inductance and capacitance. Likewise it is difficult to maintain a constant transmission line impedance through the probe structure. Thus some level of signal distortion and attenuation is therefore inevitable. Since distortion and attenuation generally increase with signal frequency, such signal distortion and attention provide a barrier to accurate high frequency testing.

The present invention represents a next step in the process of improving the frequency response of probe card assembly 22, and to understand the invention, it is helpful to first model the signal path through probe card assembly 22, and the tester circuits and DUT it interconnects, with an equivalent circuit diagram. We can then study the effects on frequency response of various impedance values in the signal paths provided by a probe card assembly using a conventional circuit simulator programmed to simulate the frequency response of the equivalent circuit in a well-known manner.

FIG. 4 is an equivalent circuit diagram of the signal path between a driver 44 and a receiver 46 within a single tester channel 14 and a receiver 48 and driver 50 linked to a bond pad 52 within DUT 12. We assume in this example that the DUT terminal being tested is a bi-directional input/output terminal, and therefore DUT 12 is depicted as including both a driver 50 for transmitting a DUT output signal from bond pad 50, and receiver 48 for receiving a DUT input signal arriving at bond pad 52. Tester channel 14 is modeled as an ideal driver 44 linked through its output resistance R1, a transmission line (if any) having a characteristic impedance $Z0_1$, and pogo pin 30 to a pad 54 on the upper surface of probe card 32. The capacitances of pogo pin 30 and of a pad on the surface of probe card 32 for receiving that pogo pin are represented by a shunt capacitor $C_1$. probe card 32 of FIG. 3 includes a microstrip trace of characteristic impedance $Z0_3$ on one of its surfaces for routing the signal horizontally from pad 54. Probe card 32 may also include one or more vias for routing the signal vertically through probe card 32. The capacitances of such vias are included in $C_1$ and a capacitor $C_2$. A via also has inductance and resistance, but since its capacitance predominates, it can be adequately modeled as a single shunt capacitor.

Spring connectors 40 and 42 of interposer 38 of FIG. 3 are modeled in FIG. 4 by a pair of series-connected inductors $L_1$ and $L_2$. Interposer 38 includes a vertical via linking connectors 40 and 42, and the capacitance of that via is suitably represented by a single shunt capacitor $C_3$. Space transformer 34 of FIG. 3 includes a microstrip trace for routing the signal horizontally across one of its surfaces, and that trace appears in FIG. 4 as characteristic impedance $Z0_4$. A pair of shunt capacitors $C_4$ and $C_5$ represent the capacitance of a contact pad on the upper surface of space transformer 34 and the capacitance of a via passing vertically through the space transformer 22. The probe 36 of FIG. 3 that links the space transformer 22 to bond pad 52 of DUT 12 is primarily inductive and is suitably represented in FIG. 4 by an inductor $L3$. The DUT output driver 50 supplies a DUT output signal to bond pad 52 through its output resistance $R_3$ while receiver 48 of DUT 12 receives a DUT input signal arriving at bond pad 52 with an input impedance $R_4$. DUT 12 will typically include an internal electrostatic protection device (ESD) linked to bond pad 52 for protecting DUT 12 from high-voltage electrostatic noise. The ESD device impedance (mostly capacitive) is represented in FIG. 4 by a shunt capacitor $C_6$.

The circuit formed by capacitors C1–C6, inductors L1–L3, resistors R1–R4, and transmission line impedances $Z0_1$–$Z0_4$ has a reactive impedance that can substantially attenuate and distort signals passing between driver 44 and receiver 48. As discussed above, the conventional approach to reducing the amount of signal distortion and attenuation has been to minimize to the extent possible the various series inductances L1–L3 and shunt capacitances C1–C6 along the path. It is also a common practice to adjust all of resistances R1–R4 and characteristic impedances $Z0_1$–$Z0_4$ to similar values (typically a standardized 50 Ohms in high-frequency applications). Such impedance matching reduces signal reflections, thereby reducing the amount of distortion caused by the signal path.

Table I below lists impedance values of the various components FIG. 4 when impedances $R_1$–$R_3$ are set to 50 Ohms and all inductances and capacitances have been set to typical minimum attainable values in accordance with conventional practice.

TABLE I

| Component | Value |
|---|---|
| $R_1$–$R_4$ | 50 Ohms |
| $Z0_1$–$Z0_4$ | 50 Ohms |
| $C_1$ | 0.4 pF |
| $C_2$ | 0.1 pF |
| $C_3$ | 0.1 pF |
| $C_4$ | 0.1 pF |
| $C_5$ | 0.1 pF |
| $C_6$ | 0.05 pF |
| $L_1$ | 0.8 nH |
| $L_2$ | 0.8 nH |
| $L_3$ | 0.8 nH |

FIG. 5 (plot A) illustrates the frequency response of the interconnect system model of FIG. 4 when components are set to the values indicated in Table I. In particular, FIG. 5 plots signal attenuation as a function of frequency for signals passing from tester driver 44 to DUT receiver 48. The frequency response for signal passing in the other direction from driver 50 to receiver 46 will be generally similar to that shown in FIG. 5 though there will be minor differences due to a lack of symmetry.

The "optimal" frequency response characteristics for the interconnect system depicted in FIG. 4 depends on the nature of the signals it is to convey. For example, when DUT 12 communicates via a high-frequency digital signal, we may want the interconnect system to pass high frequency signals, but we may not be too concerned about signal distortion, and therefore may be able to tolerate a reasonable amount of ripple in the passband. Under such circumstances we would want the interconnect system's passband to be as wide as possible while other characteristics of the interconnect frequency response are of lesser importance. On the other hand when DUT 12, for example, communicates via a low-frequency analog signal, we may want the interconnect system to convey low frequency signals with little distortion or noise, but we may want a wide bandwidth. Under such conditions, the optimal frequency response for the interconnect system may include a passband that is as flat as possible but only as wide as needed to pass the highest frequency signal expected. We would also want all areas of the stopband to have maximal attenuation so as to block high frequency noise.

As we see in FIG. 5 (plot A), the passband (usually defined as the frequency at which attenuation first falls by 3 dB from its level at zero frequency) is about 2 GHz. Thus while the interconnect system performance may be acceptable for signals of frequencies ranging between 0 and 2 GHz when a maximum 3 dB attenuation is acceptable the interconnect system frequency response depicted by plot A would not be suitable for conveying signals of frequencies exceeding 2 GHz. We also note that the passband is not particularly flat at frequencies above 1 GHz. Since passband ripple distorts signals, then in applications where low distortion is required, the interconnect system frequency response depicted in plot A of FIG. 5 may not be suitable for conveying signals above 1 MHz. We further note that the stopband has several large peaks at frequencies above 2 GHz and may therefore fail to sufficiently attenuate noise at those frequencies. Thus the interconnect system may not be suitable in applications where we want to greatly attenuate all high frequency noise above a certain maximum signal frequency.

Improved Interconnect System

According to conventional practice, the frequency response of a probe card assembly is "optimized" for all applications by minimizing both its shunt capacitance and series inductance. However while reducing interconnect system inductance and capacitance generally helps to increase bandwidth and reduce signal distortion, it is not true that setting system inductance and capacitance as low as possible necessarily optimizes the frequency response of the system for any particular application. In accordance with the invention, system frequency response is actually improved by increasing the inductance or capacitance of one or more of the elements forming the signal path through the probe card assembly above their minimum levels so as to appropriately adjust their values relative to one another.

Table II compares typical impedance values of the elements of FIG. 4 set in accordance with prior art practice (Column A) to suitable impedance selected in accordance with the present invention (Column B) in an application where we want to maximize the passband power.

TABLE II

| Component | Impedance A | Impedance B |
|---|---|---|
| $R_1$–$R_4$ | 50 Ohms | 50 Ohms |
| $Z0_1$–$Z0_4$ | 50 Ohms | 50 Ohms |
| $C_1$ | 0.4pF | 0.4pF |
| $C_2$ | 0.1pF | 0.7pF |

TABLE II-continued

| Component | Impedance A | Impedance B |
|---|---|---|
| $C_3$ | 0.1 pF | 1.3 pF |
| $C_4$ | 0.1 pF | 0.5 pF |
| $C_5$ | 0.1 pF | 1.1 pF |
| $C_6$ | 0.05 pF | 0.1 pF |
| $L_1$ | 0.8 nH | 0.8 nH |
| $L_2$ | 0.8 nH | 0.8 nH |
| $L_3$ | 0.8 nH | 0.8 nH |

The impedance values listed Table I are repeated in column A of Table II. Plot A of FIG. 5 therefore also represents the frequency response of the probe card assembly equivalent circuit of FIG. 4 when values of its circuit components are set in accordance with prior art practice to typical minimum attainable values as listed in Table II, column A. Plot B of FIG. 5 represents the frequency response of the probe card assembly equivalent circuit of FIG. 4 when values of its circuit components are set in accordance with the present invention as listed in Table II, column B.

Note that while columns A and B provide the same resistance, characteristic impedance and inductance values, the capacitances listed in column B are somewhat higher than those listed in column A. Conventional wisdom tells us to expect that due to the increase in capacitance values we would expect deterioration in frequency response as we move from plot A to plot B. For example we would expect plot B to exhibit a narrower bandwidth and/or more ripple in the passband than plot A. However quite the opposite is true. Note that whereas plot A has a bandwidth of about 2 GHz, plot B has a substantially wider bandwidth, about 5 GHz. Note also that plot B has relatively less ripple than plot A over all frequency ranges up to about 8 GHz.

In accordance with the invention, the impedance values of column B of Table II were not simply set to their lowest attainable values, but were instead carefully adjusted relative to one another and relative to the physical topology of the interconnect system to optimize the frequency response of the probe card assembly. In this particular example the values listed in Table II, column B were chosen to maximize the power conveyed in the passband—that is, t:o maximize the amount of attenuation integrated over the full passband range. However other impedance values may be selected to optimize other characteristics or combinations of characteristics of frequency response for a given application. Thus for example, we may adjust impedance values to maximize bandwidth, to minimize ripple, to provide rapid fall off in the stop band, or some combination thereof. Of course we are constrained in our choices for those impedance values; they can be no smaller than the minimum attainable values listed in column A of Table I. But subject to that constraint, we have a wide latitude in choosing impedance values that will optimize frequency response of the interconnect system for any given application.

Thus to optimize the frequency response of the interconnect system illustrated in FIG. 4, we first define the frequency response characteristic(s) that we want to optimize. We also determine the minimum practically attainable impedance value for each component of: the interconnect system. We then determine a combination of impedance values equal to or larger than those minimum attainable values that will optimize the desired frequency response characteristics. In the example of Table II, column B, it happened that the optimal set of impedance parameters mandated that inductances be minimized and capacitances be increased above their minimums. However in other applications, where we want to optimize other frequency response characteristics, it may be that inductances could be increased above their minimums. Also as discussed below, inductances may be increased in order to compensate for impedance mismatches.

Butterworth and Chebyshev Filters

It is beneficial to think of the equivalent circuit of the interconnect system illustrated in FIG. 4 as a multiple pole filter. By appropriately adjusting the series inductance and shunt capacitances relative to one another and to the other impedance components of the interconnect system, the interconnect system can be made to behave, for example, like a well-known, multi-pole "Butterworth" or "Chebyshev" filter. It is well understood how to adjust the component values of such filters in order to obtain a desired frequency response.

As mentioned above, the frequency response of an interconnect system has many characteristics and that its "optimal" frequency response is application-dependent. Thus the appropriate values to which we adjust the various impedances along the signals paths of probe head assembly 22 should be adjusted depends on which frequency response and impedance characteristics are most important for the particular application. In the example of Table II, column B, capacitance values were chosen to maximize the passband power. However other combinations of impedance values can optimize other characteristics of the interconnect system. Thus for example when the interconnect system is to convey a lower frequency analog signal with minimal distortion, and where band width is not so important, it may be desirable that the frequency response of the interconnect system have a "maximally flat" passband, having the least possible amount of ripple. In such case we will want to adjust the interconnect system component impedance values so that the system behaves like a Butterworth filter which does provide a maximally flat frequency response.

In most applications, however, optimal frequency response will be a tradeoff between the bandwidth, allowable passband ripple, phase response and stopband attenuation. Accordingly the values of inductive and capacitive components can be selected so that the interconnect system behaves as a form of the well-known, multiple-pole Chebyshev filter. The design of multi-pole Butterworth and Chebyshev filters, including appropriate choices for filter component values so as to optimize one or more combinations of characteristics of filter's frequency response, is well-known to those skilled in the art. See for example, pages 59–68 of the book *Introduction to Radio Frequency Design* by W. H. Hayward, published 1982 by Prentice-Hall, Inc., and incorporated herein by reference. Those skilled in the art are well aware of how to adjust the inductance and capacitance of the various portions of the various structures along the signal paths provided by probe head assembly 22 of FIG. 3. The present invention applies conventional filter design principles to determine how to chose the most appropriate values for that inductance and capacitance for the intended application.

Impedance Matching

Driver and receiver impedances R1–R4, and the various transmission line impedances $Z0_1$–$Z0_4$ are typically set to similar values (e.g., 50 Ohms) to prevent signal reflections which degrade system frequency response, and the values for these components were chosen in Table II, column B in order to conform with industry practice. However in accordance with the invention, we need not necessarily do that because we can compensate for resistive or characteristic impedance mismatch by appropriately adjusting the series inductance and shunt capacitance values. For example pages 59–58 of the above-mentioned book *Introduction to Radio Frequency Design* illustrate how to adjust other filter component values to obtain Butterworth and Chebyshev filter frequency response behavior even when such resistive and characteristic impedances are mismatched.

While the forgoing specification has described preferred embodiment(s) of the present invention, one skilled in the art may make many modifications to the preferred embodiment without departing from the invention in its broader aspects. For example, while in the preferred embodiment the interconnect system employs bond wires 22 and 27 and package legs 24 and 29 to connect nodes of ICs 12 and 14 to PCB trace 26, other types of inductive conductors, such as for example spring wires, could be employed to connect nodes of an integrated circuit to a PCB trace. The appended claims therefore are intended to cover all such modifications as fall within the true scope and spirit of the invention.

What is claimed is:

1. A signal path for linking a node of an electronic device to a terminal to an electronic device tester, the signal path comprising:
   a probe for contacting said node; and
   a conductive path for linking said probe to said terminal,
   wherein said node, said probe, said terminal and said conductive path have impedances sized relative to one another to substantially optimize a frequency response characteristic of said signal path.

2. The signal path in accordance with claim 1 wherein said impedances include inductances in series with said signal path and capacitances shunting said signal path.

3. The signal path in accordance with claim 1 wherein said conductive path comprises:
   a probe card including first conductors forming a first part of said conductive path;
   a space transformer including second conductors forming a second part of said conductive path; and
   an interposer including third conductors for conveying signals between said first and second conductors,
   wherein said impedances include impedances of said node and of said first, second and third conductors.

4. The signal path in accordance with claim 1 wherein said frequency response characteristic is one of maximal passband width, maximal passband flatness and maximal passband power.

5. The signal path in accordance with claim 1 wherein said impedances are sized relative to one another so that said signal path forms a multiple-pole Butterworth filter.

6. The signal path in accordance with claim 1 wherein said impedances are sized relative to one another so that said interconnect system forms a multiple-pole Chebyshev filter.

7. A signal path for linking a node of an integrated circuit (IC) to a terminal of an IC tester, the signal path comprising:
   a conductive pad implemented on said IC and linked to said node;
   a probe for contacting said conductive pad; and
   conductive means for linking said probe to said terminal,
   wherein said conductive pad, said terminal and said conductive means have impedances sized relative to one another to substantially optimize a frequency response characteristic of said signal path.

8. The signal path in accordance with claim 7 wherein said impedances include inductances in series with said signal path and capacitances shunting said signal path.

9. The signal path in accordance with claim 7 wherein said conductive means includes a printed circuit board via having a capacitance that is one of said impedances.

10. The signal path in accordance with claim 7 wherein said conductive means includes a trace having a characteristic impedance that is one of said impedances.

11. The signal path in accordance with claim 7 wherein said conductive means includes a spring contact having an inductance that is one of said impedances.

12. A signal path for linking a node of an integrated circuit (IC) to a terminal of an IC tester, the signal path comprising:
   a conductive pad implemented on said IC and linked to said node;
   a probe for contacting said conductive Pad; and
   conductive means for linking said probe to said terminal,
   wherein said conductive pad, said terminal and said conductive means have impedances sized relative to one another to substantially optimize a frequency response characteristic of said signal path, and
   wherein said conductive means comprises:
      a printed circuit board via having a capacitance that is one of said impedances,
      a trace having a characteristic impedance that is one of said impedances, and
      a spring contact having an inductance that is one of said impedances.

13. The signal path in accordance with claim 7 wherein said conductive means comprises:
   a probe card including first conductors forming a first part of said signal path;
   a space transformer including second conductors forming a second part of said signal path; and
   an interposer including a third conductor for conveying a signal between said first and second conductors,
   wherein said impedances include impedances of said first, second and third conductors.

14. The signal path in accordance with claim 7 wherein said frequency response characteristic is one of maximal passband width, maximal passband flatness and maximal passband power.

15. The signal path in accordance with claim 7 wherein said impedances are sized relative to one another so that said interconnect system forms a multiple-pole Butterworth filter.

16. The signal path in accordance with claim 7 wherein said impedances are sized relative to one another so that said interconnect system forms a multiple-pole Chebyshev filter.

17. A method for sizing impedances of a signal path connecting a node of an integrated circuit (IC) to a terminal of an IC tester, wherein the signal path comprises a bond pad connected to said node, a probe contacting said bond pad, and conductive means linking said probe to said terminal, the method comprising the step of
   adjusting impedances of said bond pad, said probe, and said conductive means relative to one another so as to optimize a characteristic of a frequency response of said signal path.

18. The method in accordance with claim 17 wherein said characteristic of said frequency response is one of maximal passband width, maximal passband flatness and maximal passband power.

19. The method in accordance with claim 17 wherein said impedances are adjusted such that said signal path acts substantially as a multiple-pole Butterworth filter.

20. The method in accordance with claim 17 wherein said impedances are adjusted such that said signal path acts substantially as a multiple-pole Chebyshev filter.

21. A signal path for linking a node of an integrated circuit (IC) to a terminal of an IC tester, the signal path comprising:
- a conductive pad implemented on said IC and linked to said node;
- a probe for contacting said conductive pad; and
- conductive means for linking said probe to said terminal,
- wherein said conductive pad, said probe, said terminal and said conductive means have impedances sized relative to one another to substantially optimize a frequency response characteristic of said signal path, and
- wherein said conductive means comprises a printed circuit board via having a capacitance that is one of said impedances.

22. A signal path for linking a node of an integrated circuit (IC) to a terminal of an IC tester, the signal path comprising:
- a probe for contacting said node; and
- conductive means for linking said probe to said terminal,
- wherein said node, said probe and said conductive means have impedances sized relative to one another to substantially optimize a frequency characteristic of said signal path, and
- wherein said conductive means comprises a printed circuit board via having a capacitance that is one of said impedances.

* * * * *